(12) United States Patent
Bernardinis

(10) Patent No.: US 9,065,474 B2
(45) Date of Patent: Jun. 23, 2015

(54) TIME-INTERLEAVED SINGLE INPUT DUAL OUTPUT SIGMA-DELTA MODULATOR

(71) Applicant: Analog Devices, Inc., Norwood, MA (US)

(72) Inventor: Gabriele Bernardinis, Los Gatos, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/166,486

(22) Filed: Jan. 28, 2014

(65) Prior Publication Data

US 2014/0340249 A1 Nov. 20, 2014

Related U.S. Application Data

(60) Provisional application No. 61/824,837, filed on May 17, 2013.

(51) Int. Cl.
   *H03M 3/02* (2006.01)
   *H03M 3/00* (2006.01)

(52) U.S. Cl.
   CPC ..................................... *H03M 3/47* (2013.01)

(58) Field of Classification Search
   CPC ....... H03M 3/468; H03M 3/47; H03M 1/121; H03M 1/1215; H02M 3/156–3/3378
   USPC .................................................. 341/141, 143
   See application file for complete search history.

(56) References Cited

U.S. PATENT DOCUMENTS

| 5,150,120 A | * | 9/1992 | Yunus ........................... 341/143 |
| 7,193,545 B2 | * | 3/2007 | Morrow et al. ............... 341/143 |
| 7,529,108 B2 | | 5/2009 | Bakker |
| 7,919,941 B2 | * | 4/2011 | Aoyagi et al. ................ 318/255 |
| 2002/0118128 A1 | * | 8/2002 | Siferd ........................... 341/141 |
| 2012/0281784 A1 | * | 11/2012 | Beydoun et al. ............. 375/295 |

FOREIGN PATENT DOCUMENTS

WO   WO-2009090514 A1   7/2009

OTHER PUBLICATIONS

Kester, Walt, "ADC Architectures III: Sigma-Delta ADC Basics", [Online]. Retrieved from the Internet: <http://www.analog.com/static/imported-files/tutorials/MT-022.pdf>, (Accessed Jan. 28, 2014), 12 pgs.

* cited by examiner

*Primary Examiner* — Howard Williams
(74) *Attorney, Agent, or Firm* — Schwegman Lundberg & Woessner, P.A.

(57) ABSTRACT

Systems and methods can detect a relationship between portions of an analog input signal using a single sensing point, and can provide information about the detected relationship in a digital signal. A system can include an input transconductance stage, a gate circuit driven by a first control signal, a phase-select multiplexer circuit driven by a second control signal, and multiple analog-to-digital converter (ADC) channels. The ADC channels can include respective integrator circuits that receive information from the phase-select multiplexer circuit, and the ADC channels can include comparator circuits coupled to respective outputs of the integrator circuits. The outputs of the comparator circuits can be used as control signals for respective feedback multiplexers, or respective feedback current DACs, that selectively couple reference currents to the respective integrator circuit inputs. The feedback current DACs can be configured to continuously provide information to the respective integrator circuits.

20 Claims, 5 Drawing Sheets

US 9,065,474 B2

TIME-INTERLEAVED SINGLE INPUT DUAL OUTPUT SIGMA-DELTA MODULATOR

CLAIM OF PRIORITY

This patent application claims the benefit of priority, under 35 U.S.C. Section 119(e), to U.S. Provisional Patent Application Ser. No. 61/824,837, entitled "SIGMA DELTA DIFFERENTIATOR", filed on May 17, 2013, which is hereby incorporated by reference herein in its entirety.

TECHNICAL FIELD OF THE DISCLOSURE

This disclosure relates generally to integrated circuits, and more particularly, but not by way of limitation, to sigma-delta modulation circuits.

BACKGROUND

A sigma-delta converter (or delta-sigma converter) can be used to convert an analog signal to a digital signal, such as for audio, communications, measurement, or other applications. A sigma-delta analog-to-digital converter (ΣΔ ADC) includes analog and digital signal processing components. The analog components can form a sigma-delta modulator using a comparator, a switch, and one or more integrators and analog summing circuits. The digital components can include a digital signal processor, generally configured as a filter and decimator.

Delta modulation techniques can be used to generate information about a change in signal value between consecutive samples. In delta modulation, an analog signal can be quantized by a single-bit ADC circuit, for example, a comparator circuit. A digital ADC output signal can be converted to an analog signal, such as using a one-bit digital-to-analog converter (DAC) circuit.

In operation, a sigma-delta ADC circuit can receive an analog input signal that includes a signal portion from a feedback DAC circuit. The input signal can be provided to an integrator circuit, and the output of the integrator circuit can be provided to a comparator circuit. The output of the comparator circuit can be provided to the feedback DAC circuit and a digital output filter. A negative feedback loop can be established using the comparator circuit and the feedback DAC circuit. The negative feedback loop can provide an average feedback DAC circuit output voltage that is substantially equal to the analog input signal voltage. As a result, the average value of the analog input signal voltage can be encoded in the serial bit stream output from the comparator. The digital output filter can process the serial bit stream and provide the sigma-delta ADC circuit output signal.

OVERVIEW

Systems and methods can detect a relationship between portions of an analog input signal using a single sensing point, and can provide information about the detected relationship in a digital signal, such as using a sigma-delta analog-to-digital converter (ADC) circuit. A sigma-delta ADC can include a difference amplifier coupled to an integrator. The output of the integrator can be coupled to a quantizer, such as a comparator (e.g., a "1 bit" ADC) or flash ADC. The output of the quantizer can be digitally filtered or decimated, and fed to a digital counter, such as to provide a digital value corresponding to an amplitude of an analog input signal. The output of the quantizer can be fed back through a digital-to-analog converter (DAC) to a summing node of a difference amplifier, such as can be coupled to an input of the integrator. In operation of the sigma-delta ADC, as the analog input signal to be digitized increases, the frequency of "ones" in the digital output bit stream increases, and the frequency of "zeros" decreases. Similarly, as the input signal decreases, such as toward a negative reference value, the number of ones decreases and the number of zeros increases.

The present inventors have recognized, among other things, that a problem to be solved can include sensing a relationship between two or more portions of an analog signal, such as at a single sensing location or at different times. The problem can include transforming a received analog signal into a digital signal, such as for downstream processing in the digital domain. In an example, the problem can include sensing a voltage signal across a circuit element based on two (or more) different currents flowing through the circuit element.

The present disclosure can help provide a solution to this problem, such as by providing a system including an input transconductance stage, a gate circuit driven by a first control signal, a phase-select multiplexer circuit driven by a second control signal, and multiple ADC channels. The multiple ADC channels can include multiple respective integrator circuits that receive information from the phase-select multiplexer circuit, and the ADC channels can include multiple respective comparator circuits coupled to respective outputs of the integrator circuits. The outputs of the comparator circuits can be used as control signals for channel-specific feedback multiplexers, or channel-specific feedback current DACs, that can selectively couple reference currents to the respective integrator circuit inputs. The feedback current DACs can be configured to continuously provide information about the ADC output to the respective integrator circuits.

The present disclosure includes a pair of sigma-delta ADC circuits that use a reference current selectively applied at inputs of channel-specific sigma-delta ADC integrator circuits. The reference current can be provided using multiple source currents, such as processed by a chopper circuit that operates according to a specified duty cycle, to provide matched signals at the integrator inputs.

Applications can include detecting a relationship, such as a difference, between two signals at a single reference terminal, and transforming information about the detected relationship into the digital domain for downstream signal processing. In power applications, for example, the two signals can include current signals flowing through the same sensing element (e.g., a resistor, a diode, or a diode-connected BJT, among others), and the difference can be determined between the average currents in the two channels.

Generally, each signal can be sampled several times during each phase and converted with an ADC using a signal resolution that is sufficient to detect a specified minimum difference between the two signals. Respective averages of the two signals can be calculated in the digital domain, and the difference between the averages can be identified. In an approach, two separate ADC circuit channels can be used, and an analog multiplexer can be provided to properly connect each ADC to the sensing element at a designated time. A difference between the sensed measurements can then be determined using the results from each of the ADC circuit channels. In a two-channel ADC approach, both converters can be matched to reduce gain or offset errors.

In an example, two continuous-time sigma-delta ADCs can be used, such as sharing a common input transconductance stage, and using one or more feedback DAC circuits. Various techniques can be used to avoid conversion errors when the input signal is switched from one channel to the other. For example, when a difference between two signals is to be measured at a specified time, an interleaved sample and hold circuit at the front end can be used. In this manner, a high conversion accuracy-to-circuit size ratio can be achieved.

This overview is intended to provide an overview of subject matter of the present patent application. It is not intended to provide an exclusive or exhaustive explanation of the invention. The detailed description is included to provide further information about the present patent application.

DETAILED DESCRIPTION

A signal processor circuit can use information about a relationship between two or more electrical signals such as to update or to provide a control signal to a downstream circuit or process. Some circuits can be configured to detect a relationship between two or more analog signals using a single sensing point, and to transform the detected relationship into a digital signal for further processing in the digital domain. In a power system application, for example, a pair of analog signals can include two different current signals that flow through a common circuit or sensing element (e.g., a resistor). The detected relationship can include a difference, such as using information about the resulting voltages, between the average currents in the two signals.

Relationship or difference detection can be implemented in multiple different ways. In an example, each analog signal can be sampled one or more times, such as during each signal phase, and information about the signal can be converted with an analog-to-digital converter (ADC) circuit for further processing in the digital domain. The ADC circuit can have a sufficient resolution to detect some minimum difference between the two signals. In an example, an average of each of two analog signals can be calculated in the digital domain, and a difference between the averages can be subsequently digitally calculated. In an example, two sigma-delta ADC circuits can be used to sample respective analog signals. The sigma-delta ADC circuits can be used with an analog multiplexer circuit to selectively couple each of the sigma-delta ADC circuits to a common sensing element at an appropriate time.

Figure 1:
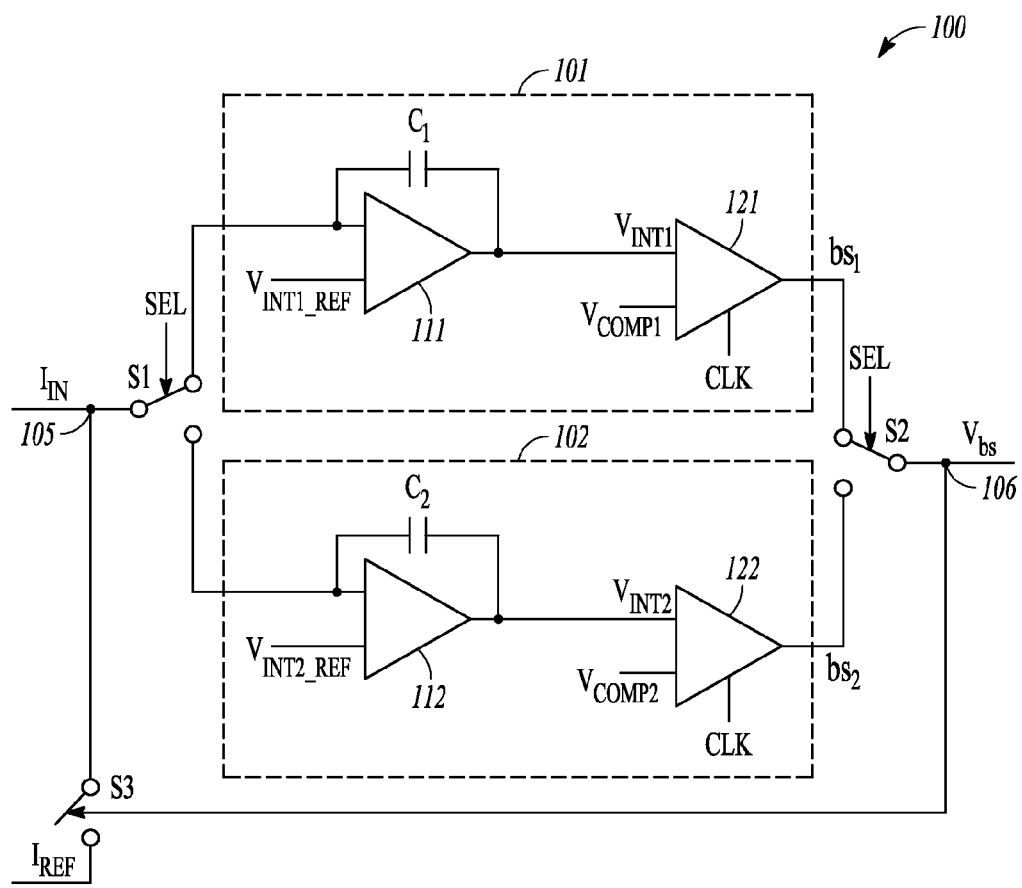
FIG. 1 illustrates generally an example of a portion of an analog-to-digital converter circuit.

FIG. 1 illustrates generally an example of a portion of an ADC circuit 100, such as can be used in a controller portion of a power converter circuit. The ADC circuit 100 can be used with one or more downstream digital processor circuits to identify a difference between two analog input signals and to provide a digital output signal that includes information about the difference. The information about the difference can be used by a downstream controller circuit (e.g., a pulse width modulator circuit), not shown, to adjust pulses that operate one or more switches in the power converter circuit.

The ADC circuit 100 can include first and second modulator circuits 101 and 102. The first and second modulator circuits 101 and 102 can include respective integrator circuits 111 and 112, and can include respective comparator circuits 121 and 122, such as latched comparator circuits. In an example, the comparator circuits 121 and 122 can include respective flip-flop circuits. The ADC circuit 100 can include a first switch S1 that can selectively couple an input node 105 to one of the integrator circuits 111 and 112. The input node 105 varies according to an input signal $I_{IN}$, and the switch S1 is operable in response to a control signal (SEL).

The comparator circuits 121 and 122 can be controlled using a sampling clock signal (CLK) at a clock frequency $F_{CLK}$. The outputs of the comparator circuits 121 and 122 can provide respective bit stream signals $bs_1$ and $bs_2$. The comparator circuit outputs can be selectively coupled to an output node 106 using a second switch S2 to provide an output signal $V_{bs}$ that can include a digital bit stream based on $bs_1$ or $bs_2$. Switches S1 and S2 can operate synchronously according to the same control signal SEL, such as at a specified switching frequency $F_{SW}$.

In an example, a dynamic range of the ADC circuit 100 can be determined in part by a reference signal, such as a reference current $I_{REF}$. The reference signal can be selectively provided using a third switch S3. When the reference signal is provided, such as when the output signal $V_{bs}$ is at a logic "high" or digital "1", the reference signal can be summed with the input signal $I_{IN}$ at the input node 105. The reference signal can thus provide a feedback signal that corresponds to the state of the output signal $V_{bs}$. The output signal $V_{bs}$ can be provided to one or more application-specific downstream circuits, such as a decimation filter.

In the example of FIG. 1, the input signal $I_{IN}$ can be selectively integrated using one of the integrator circuits 111 and 112, and can be modulated to provide the output signal $V_{bs}$ bit stream. For example, during a first phase of $I_{IN}$, the signal can be modulated using the first modulator circuit 101, and during a subsequent second phase of $I_{IN}$, the signal can be modulated using the second modulator circuit 102. The output signals for each phase can correspond to different portions of the output signal $V_{bs}$. In an example, a difference between the different phases of the input signal $I_{IN}$ can be determined using the different portions of the output signal $V_{bs}$. In a power converter example, the difference between digital word values in the output signal $V_{bs}$ can be used to adjust pulse widths corresponding to control signals applied to switches in a power supply, such as to modulate or control a power supply signal.

In an example, the ADC circuit 100 can be configured to store information in one or more of the integrator circuits 111 and 112 over multiple phases of an input signal. For example, an input signal that is not sufficiently large to be converted by the ADC circuit 100 to a logic "1" in the output signal $V_{bs}$ can be stored using one of the integrator circuits 111 and 112 and carried to the next phase or clock pulse. In this manner, the ADC circuit 100 can be used to separate current sense signals that have a frequency that is greater than the switching frequency $F_{SW}$.

In the ADC circuit 100, an encoder error can result if the switching frequency $F_{SW}$ of the SEL signal is approximately the same as, or more than, the clocking frequency $F_{CLK}$. For example, if $F_{SW}$ exceeds $F_{CLK}$, information from one or the other of the comparator circuits 121 and 122 can be lost. This encoder error can be avoided by using a dedicated feedback channel for each of the first and second modulator circuits 101 and 102.

Figure 2A:
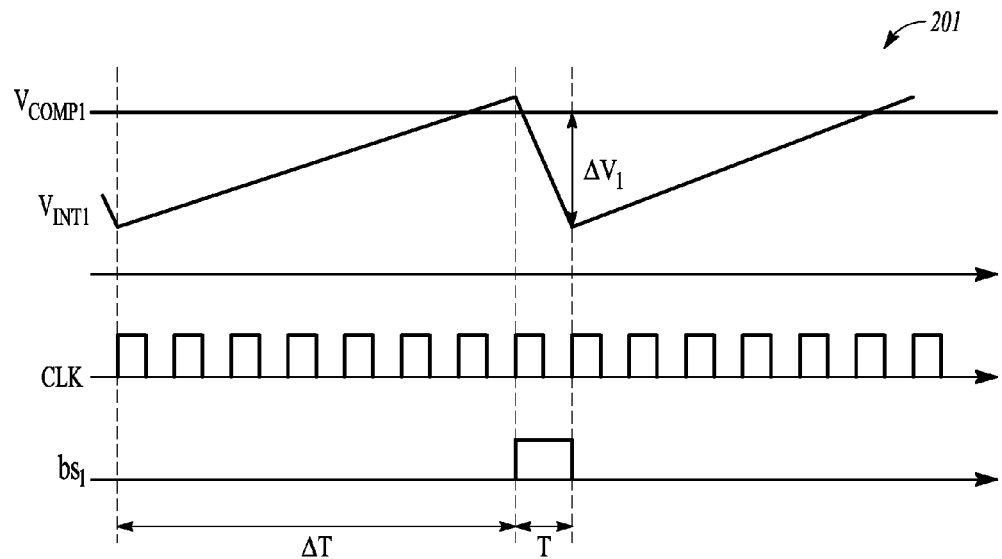
FIGS. 2A and 2B illustrate generally timing examples corresponding to an analog-to-digital converter circuit.

FIG. 2A illustrates generally a first timing example 201 corresponding to an operating mode of the first modulator circuit 101. In the example of FIG. 2A, the input current $I_{IN}$ can include a measured current signal, such as measured using a power signal sense circuit. In this example, the input current $I_{IN}$ can be constant during a phase of the SEL signal when the current flows from node 105 through switch S1, and into the first integrator circuit 111. The reference current $I_{REF}$ can be a constant current signal that flows into node 105 when switch S3 is closed. To avoid saturation of the ADC, the reference current $I_{REF}$ can be greater than the maximum input current IIN.

Assuming for an initial time that $V_{INT1}$ is less than $V_{COMP1}$ ($V_{INT1} < V_{COMP1}$), the switch S3 can be open to prevent the reference current IREF from reaching the node 105. The switch S3 can remain open until $V_{INT1}$ reaches $V_{COMP1}$. That is, while S3 is open, the voltage signal $V_{INT1}$ can rise, for example with a constant slope and over multiple clock cycles, and the voltage at the output of the integrator circuit 111 can approach a reference voltage $V_{COMP1}$ at the first comparator circuit 121. When the output voltage $V_{INT1}$ of the integrator circuit 111 exceeds the reference voltage $V_{COMP1}$, the output of the first comparator circuit 121 can change states. This output state change can cause switch S3 to close, and a negative constant current (e.g., based on a difference between the reference current $I_{REF}$ and the input current $I_{IN}$: $I_{REF} - I_{IN}$) can be applied to discharge the first integrator circuit 111 for a fixed time, such as $1/F_{CLK}$. The resulting drop in $V_{INT1}$ can be about $\Delta V_1$ in the example of FIG. 2A.

The corresponding digital output signal $bs_1$ of the first comparator circuit 121 can switch from a low state to a high state when $V_{INT1}$ exceeds $V_{COMP1}$. The digital output signal $bs_1$ can return to a low state at a subsequent clock cycle during which the output voltage $V_{INT1}$ of the integrator circuit 111 falls below the reference voltage $V_{COMP1}$.

The period of the digital output signal $bs_1$ can be a function of the voltage difference between $V_{INT1}$ and $V_{COMP1}$ ($\Delta V_1$), and of the current difference between $I_{IN}$ and $I_{REF}$. In the example of FIG. 2A, the duration T can correspond to the frequency of the clock signal CLK. The voltage difference $\Delta V_1$ can be given by:

$$\Delta V_1 = \frac{T(I_{REF} - I_{IN})}{C_1}, \quad (Eq.\ 1)$$

and the duration $\Delta T$ can be given by:

$$\Delta T = \frac{\Delta V_1 \cdot C_1}{I_{IN}} = T \frac{I_{REF} - I_{IN}}{I_{IN}}. \quad (Eq.\ 2)$$

As a result, the average of the digital output signal bs1 can be represented as:

$$bs_1 = \frac{T}{\Delta T + T} = \frac{I_{IN}}{I_{REF}}. \quad (Eq.\ 3)$$

Conversion from the analog input signal $I_{IN}$ to the digital output signal $bs_1$ can be achieved using a counter circuit to count a number of clock cycles for which the digital output signal $bs_1$ is high. In the example of FIG. 2A, the digital output signal can correspond to a digital word represented by one bit, or corresponding to one clock cycle.

Figure 2B:
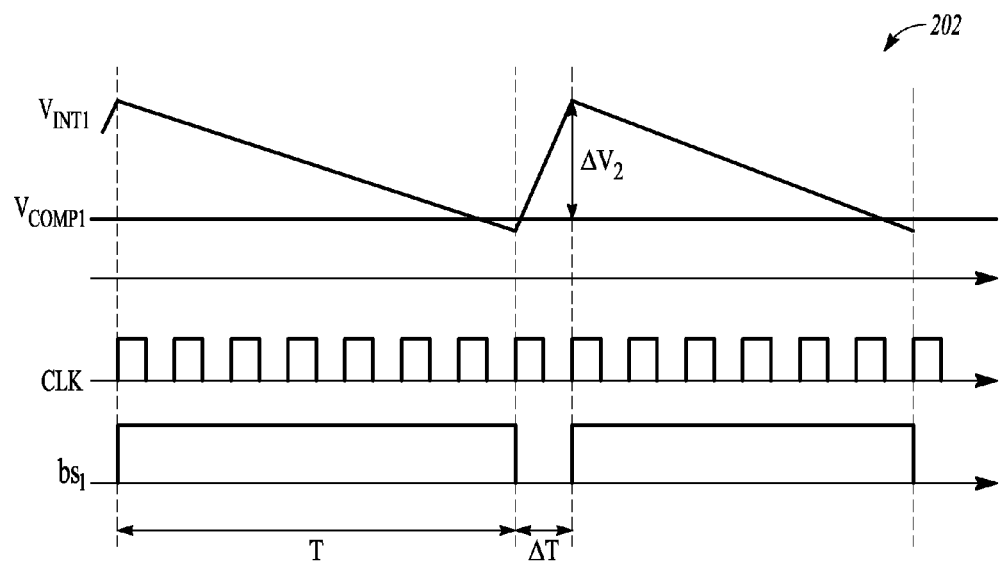

In the example of FIG. 2B, the input current $I_{IN}$ can have an initial amplitude that is about the same as the reference current $I_{REF}$. Under these conditions, S3 can be closed and the first integrator circuit 111 can integrate a small negative current (e.g., $I_{REF} - I_{IN}$), such as until the voltage signal $V_{INT1}$, at the output of the first integrator circuit 111, falls below the reference voltage $V_{COMP1}$ at the first comparator circuit 121. As $V_{INT1}$ falls below $V_{COMP1}$, the switch S3 can turn off, and the input current $I_{IN}$ can be integrated by the first integrator circuit 111 for a fixed time, such as $1/F_{CLK}$. As a result, the voltage signal $V_{INT1}$ at the output of the first integrator circuit 111 can rise, such as by an amount $\Delta V_2$ in the example of FIG. 2B. At about the same time, the digital output signal $bs_1$ can transition from a high state to a low state. In the example of FIG. 2B, the digital output signal can correspond to a digital word represented by multiple bits (e.g., 7 bits, corresponding to seven clock cycles).

Figure 3:
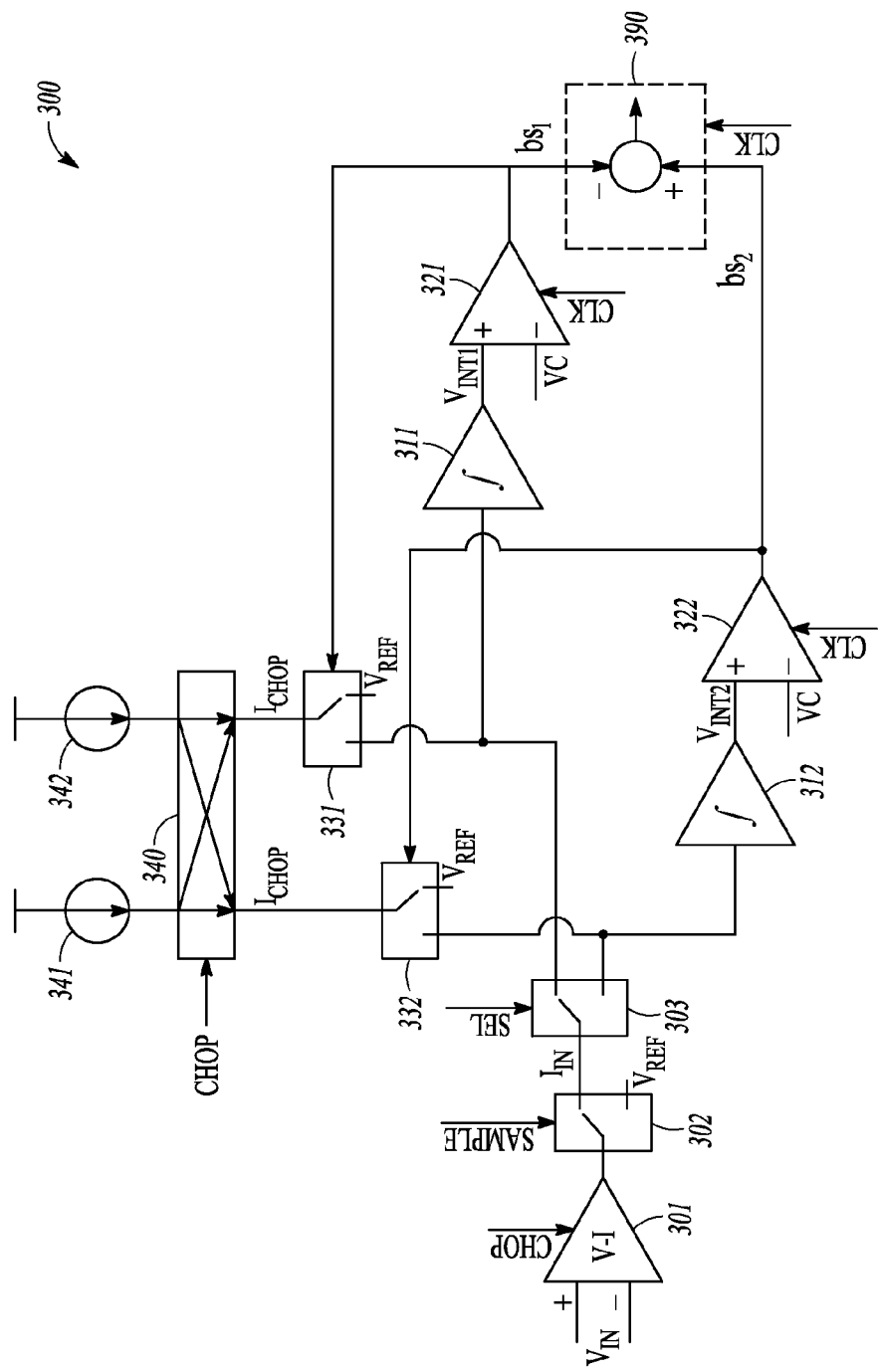
FIG. 3 illustrates generally an example of a converter circuit that includes two sigma-delta analog-to-digital converter circuit channels.

FIG. 3 illustrates generally an example of a converter circuit 300 that includes two sigma-delta ADC channels. An input signal can be selectively coupled to one or more of the sigma-delta ADC channels and a digital output signal can be provided. The converter circuit 300 can include a feedback arrangement configured to avoid conversion errors when the input signal is switched between the two ADC channels.

In the example of FIG. 3, the converter circuit 300 can include a transconductance input stage, such as can be configured to receive a voltage input signal and, in response, provide a corresponding current signal. For example, the transconductance input stage can include a transconductance amplifier 301 configured to receive a time-multiplexed analog voltage signal $V_{IN}$ and, in response, provide a corresponding time-multiplexed analog current signal $I_{IN}$. The voltage-to-current amplifier input stage can be gated, such as using a gate circuit 302 controlled by a sample control signal (SAMPLE). The transconductance input stage can be chopped, for example, at the same rate as the circuit clock (CLK), such as to reduce offset contributions at the converter output. In an example, each channel can be selected for the same duration, such as corresponding to a duty cycle of 50%. Any residual offset can be subtracted using downstream digital processing, and therefore chopping of the input stage can be unnecessary, in a first order approximation.

A phase-select multiplexer circuit 303 can be provided downstream from the gate circuit 302. The phase-select multiplexer circuit 303 can be controlled by the select signal SEL. In an example, the SAMPLE period can be generally less than or equal to the SEL signal period, such that a particular signal phase or sample period will be routed to one of the two sigma-delta ADC channels in the converter circuit 300.

In the example of FIG. 3, SAMPLE can be asserted for a duration over which the input signal is to be coupled to one of the ADC channels in the converter circuit 300. In a first state, such as when SAMPLE is high, the gate circuit 302 can couple the output of the transconductance amplifier 301 to the phase-select multiplexer circuit 303. In a second state, such as when SAMPLE is low, the gate circuit 302 can couple a DC reference voltage $V_{REF}$ to the high impedance voltage-to-current amplifier output, such as to minimize charge injection errors during a transition between operating states or signal phases. When SAMPLE is de-asserted, the input signal $I_{IN}$ can be decoupled from the input to the gate circuit 302, such as can be equivalent to an input voltage signal $V_{IN}$ of zero.

The phase-select multiplexer circuit 303, such as driven by the control signal SEL, can provide the input signal $I_{IN}$ to one of a first integrator circuit 311 in a first sigma-delta ADC channel, or to a second sigma-delta integrator circuit 312 in a second sigma-delta ADC channel. In an example, respective portions or phases of the input signal $I_{IN}$ can be integrated by a corresponding one of the first and second integrator circuits 311 and 312.

The outputs of the first and second integrator circuits 311 and 312 can be coupled to inputs of respective first and second comparator circuits 321 and 322. The first and second comparator circuits 321 and 322 can be triggered by the clock signal CLK and can be configured to receive the same or different reference voltage signal Vc. An output signal from an integrator circuit, such as a voltage signal $V_{INT1}$ from the first integrator circuit 311, can be compared to the reference voltage signal Vc. When the voltage signal $V_{INT1}$ transitions above or below the reference voltage signal Vc, an output signal from the first comparator circuit 321 can correspondingly transition, such as at a subsequent clock pulse. For example, when $V_{INT1}$ is less than Vc, the comparator circuit 321 output signal $bs_1$ can correspond to a reference level such as 0 or a logic low. When $V_{INT1}$ is greater than Vc, the comparator circuit 321 output signal $bs_1$ can transition to a 1 or logic high, such as at a subsequent clock pulse.

Information about the output states of the comparator circuits 321 and 322 can be fed back to respective inputs of the sigma-delta ADC channels. For example, the information about the output states, such as including information about the output signals $bs_1$ or $bs_2$, can be fed back to respective inputs of the first and second integrator circuits 311 and 312. The information can be fed back to nodes that are between the phase-select multiplexer circuit 303 and the respective integrator circuit inputs. That is, the channel output information can be provided to an input of an integrator circuit that is downstream from the phase-select multiplexer circuit 303. Information about the sigma-delta ADC output signals from each channel can thus be continuously fed back or provided to a respective one of the sigma-delta ADC channel inputs, independently of the SEL and SAMPLE signals. In this manner, information about a sigma-delta ADC channel output signal can influence operation of the channel without interruption, such as when the control signal SEL and the phase-select multiplexer circuit 303 change states.

The output signals $bs_1$ and $bs_2$ of the comparator circuits 321 and 322 can be independently fed back to the respective integrator circuits 311 and 312 by way of respective first and second feedback current-mode digital-to-analog converter (DAC) circuits 331 and 332. The outputs $bs_1$ and $bs_2$ can be used as digital control signals for the respective DACs 331 and 332. For example, the DACs 331 and 332 can be implemented as multiplexer (or demultiplexer) circuits that are configured to selectively couple a reference current ($I_{CHOP}$) to respective inputs of one of the integrator circuits 311 and 312. The output signals $bs_1$ and $bs_2$ can be interpreted by the DACs 331 and 332 as control signals. In this manner, a reference current signal can be selectively coupled to a respective one of the inputs of the integrator circuits 311 or 312 based on a control signal provided by a corresponding one of the outputs of the comparator circuits 321 or 322, such as in the same channel. For example, when $bs_1$ is high, the first DAC 331 can be configured to couple $I_{CHOP}$ to the input of the first integrator circuit 311. When $bs_1$ is low, $I_{CHOP}$ can be decoupled from the input of the first integrator circuit 311, and the first DAC 331 can couple $I_{CHOP}$ with the reference voltage $V_{REF}$.

In the example of FIG. 3, the current sources need not be perfectly matched. A chop circuit 340 can be configured to receive current signals from two or more current sources 341 and 342 and to provide a chopped current signal $I_{CHOP}$ to the first and second DAC circuits 331 and 332. The current sources 341 and 342 can include, among other things, current mirror circuits configured to provide current signals. The chop circuit 340 can be configured to exchange currents from the two or more current sources 341 and 342 at the same rate as CLK or at some multiple thereof, or another clock source can be used. In an example that includes the current sources 341 and 342, the chop circuit 340 can operate at a duty cycle of about 50%.

In an example, the converter circuit 300 can include a digital processor circuit 390. The digital processor circuit 390 can be configured to receive information from about the output signals $bs_1$ and $bs_2$. The digital processor circuit 390 can be configured to provide information about a relationship between portions of a multi-phase input signal ($V_{IN}$ or $I_{IN}$). In an example, a difference between portions of the multi-phase input signal at a specified time can be provided using an interleaved sample-and-hold circuit at the input to the converter circuit 300.

Figure 4:
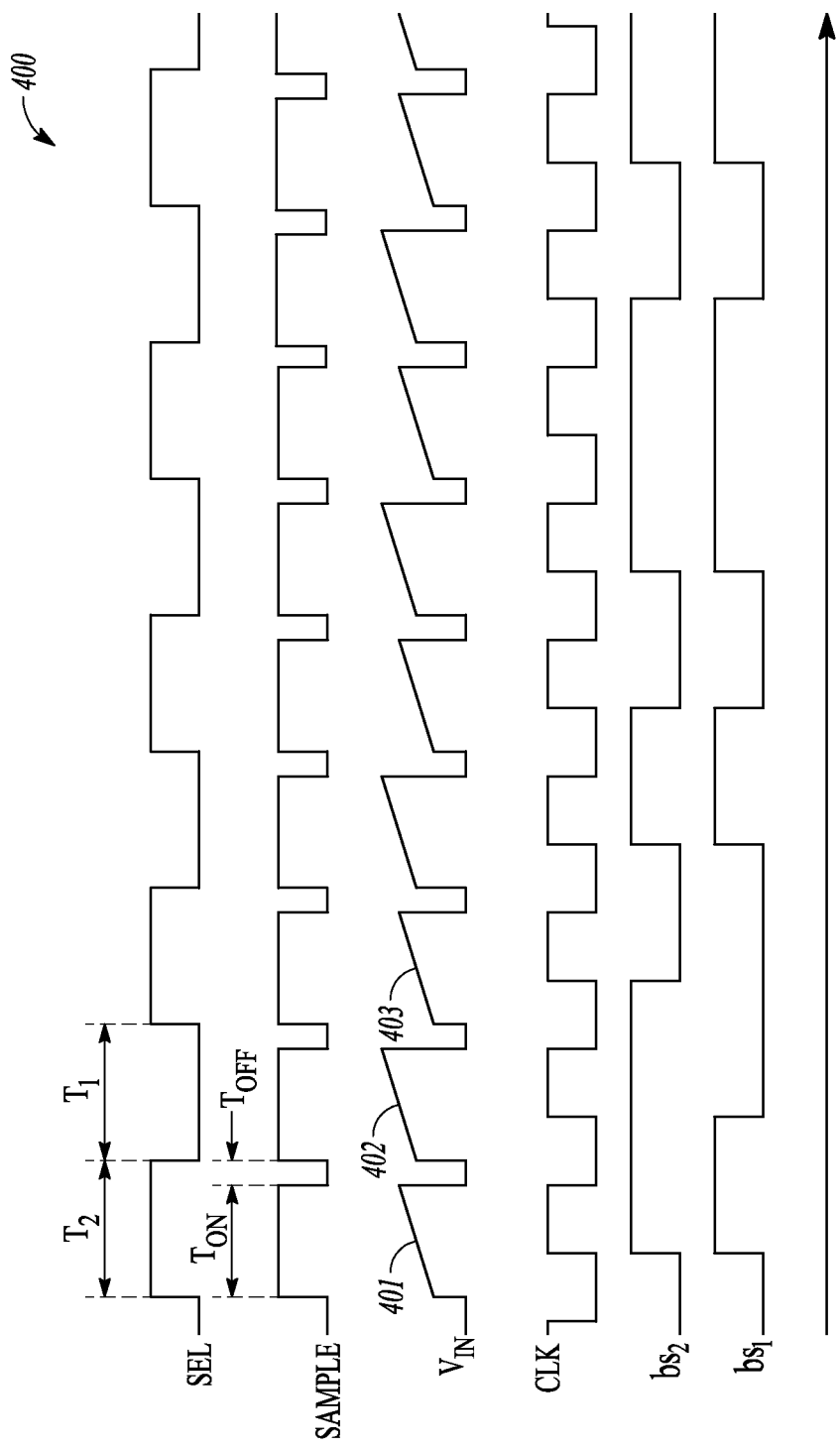
FIG. 4 illustrates generally a timing example corresponding to a converter circuit that includes two sigma-delta analog-to-digital converter circuit channels.

FIG. 4 illustrates generally a third timing example 400 corresponding to an operating mode of the converter circuit 300. In the example of FIG. 4, the SEL signal generally indicates that the input signal is provided to the first sigma-delta ADC channel during a first phase or time $T_1$, and the input signal is provided to the second sigma-delta ADC channel during a second phase or time $T_2$. That is, the first integrator circuit 311 can be configured to integrate $V_{IN}$ during a SAMPLE or $T_{ON}$ period of $T_1$, and the second integrator circuit 312 can be configured to integrate $V_{IN}$ during a SAMPLE or $T_{ON}$ period of $T_2$.

The input signal $V_{IN}$ can be generally in phase with the gating signal SAMPLE. That is, transitions between the multiple phases of the input signal $V_{IN}$ can correspond to transitions or off states of the gating signal SAMPLE. In the example of FIG. 4 and with reference to the converter circuit 300, the first and second integrator circuits 311 and 312 can be configured to integrate respective portions of the input signal $V_{IN}$ that correspond to high states of both the gating signal SAMPLE and the phase-select signal SEL. The respective digital outputs of the sigma-delta integrator circuits 311 and 312, $V_{INT1}$ and $V_{INT2}$, can be coupled to respective inputs of the comparator circuits 321 and 322, as described above. The outputs of the comparator circuits can be fed to downstream digital processing, such as to the digital processor circuit 390.

In the example of FIG. 4, the second integrator circuit 312 can be configured to receive a first portion or first pulse 401 of the multi-phase input signal $V_{IN}$. The first integrator circuit 311 can be configured to receive a second portion or second pulse 402 of the multi-phase input signal $V_{IN}$. The second integrator circuit 312 can be configured to receive a third portion or third pulse 403 of the multi-phase input signal $V_{IN}$. Accordingly, the first and second integrator circuits can alternatingly or periodically receive portions of the multi-phase input signal $V_{IN}$, such as according to the states of the control signals SEL and SAMPLE.

Various techniques can be applied to address or reduce mismatch between the multiple ADC channels. For example, the amplifiers used in the first and second integrator circuits 311 and 312 can be randomly swapped to reduce any inherent mismatch introduced by these circuits. In another example, mismatch can be addressed downstream, such as using digital processing techniques after the digital conversion is completed by the ADC channels. Generally, application requirements can dictate an acceptable level of mismatch, and in some cases, mismatch below a threshold level can be neglected.

Figure 5:
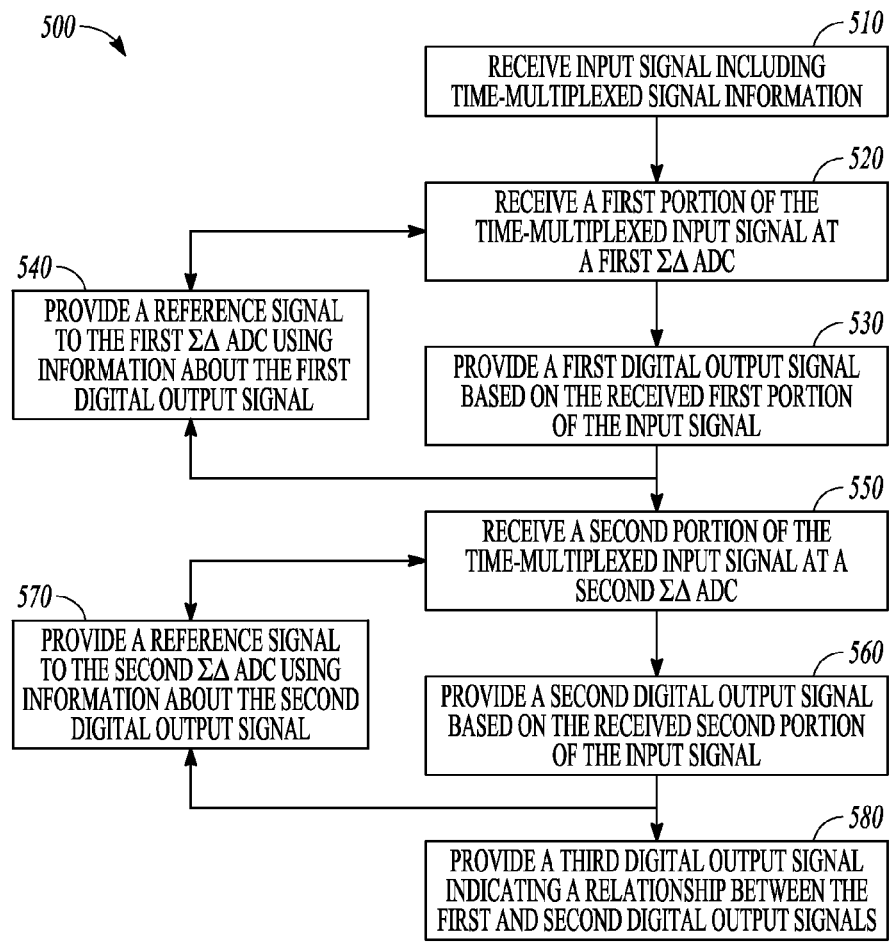
FIG. 5 illustrates generally an example that can include providing a digital output signal using information from multiple different phases of an input signal.

FIG. 5 illustrates generally an example 500 that can include providing a digital output signal using information from multiple different phases of an input signal. At 510, the example 500 can include receiving an input signal. The input signal can include a voltage signal or a current signal, such as including time-multiplexed signal information. For example, the input signal can include a periodic, two-phase voltage signal. A first phase of the voltage signal can correspond to a first time interval, and a second subsequent phase of the voltage signal can correspond to a subsequent second time interval. The first and second phases can be temporally adjacent or can be separated by a blanking period. In an example, the time-multiplexed input signal can provided to a phase-select multiplexer circuit that can be configured to receive a control signal. In response to the control signal, the phase-select multiplexer circuit can provide different portions of the input signal at different outputs of the multiplexer circuit. For example, a time-multiplexed input signal such as $V_{IN}$ or $I_{IN}$, in the example of FIG. 3, can be provided to the phase-select multiplexer circuit 303.

At 520, a first portion of the time-multiplexed input signal can be received using a first sigma-delta ADC circuit or channel. The first portion of the time-multiplexed input signal can include a first phase of the input signal. The first portion can be received using an input stage of the ADC circuit. The input stage can include, among other things, one or more of a buffer circuit, a sample-and-hold circuit, or an integrator circuit corresponding to the first sigma-delta ADC circuit.

At 530, a first digital output signal can be provided using the first sigma-delta ADC circuit. The first digital output signal can include a serial digital bit stream that is based on the first portion of the input signal received at 520. The first digital output signal can include a digital representation of the first portion of the time multiplexed input signal. In an example, the digital output signal can represent an average or other quantitative value of the input signal over a specified duration. At 530, and with reference to FIG. 3, the first digital output signal can include the digital output bit stream $bs_1$.

At 540, a reference signal can be selectively provided to the first sigma-delta ADC circuit using information about the first digital output signal. The reference signal can include a current signal or a voltage signal. In an example, the reference signal can include a chopped current signal, such as described above in the example of FIG. 3.

The first digital output signal can be used by a feedback DAC circuit, such as an ADC channel-specific DAC circuit, to gate or control application of a reference signal to the sigma-delta ADC circuit. For example, the feedback DAC circuit can be configured to switchably couple an ADC circuit input with one of a reference current signal or a reference voltage signal. The state of the first digital output signal can determine which of the reference current or the reference voltage signals is coupled to the ADC circuit input. Referring again to FIG. 3, the output signal $bs_1$ can be received and interpreted by the first feedback DAC circuit 331. In response, the first feedback DAC circuit 331 can be configured to couple one or the other of $I_{CHOP}$ and $V_{REF}$ to the input of the first integrator circuit 311, such as depending on the state of $bs_1$. The information link between the first digital output and the input to the first integrator circuit 311 can be continuously operable, such as independently of the SEL and SAMPLE control signals.

At 550, a second portion of the time-multiplexed input signal can be received, such as using a second sigma-delta ADC circuit or channel. The second portion of the time-multiplexed input signal can include a second phase of the input signal, such as subsequent to the first phase received at 520. The second portion can be received using an input stage of the second sigma-delta ADC circuit. The input stage can include, among other things, one or more of a buffer circuit, a sample-and-hold circuit, or an integrator circuit corresponding to the second sigma-delta ADC circuit.

At 560, a second digital output signal can be provided using the second sigma-delta ADC circuit. The second digital output signal can include a serial digital bit stream that is based on the second portion of the input signal received at 550. The second digital output signal can include a digital representation of the second portion of the time multiplexed input signal.

At 570, a reference signal can be selectively provided to the second sigma-delta ADC circuit using information about the second digital output signal. The reference signal can include a current signal or a voltage signal. In an example, the reference signal can include a chopped current signal, such as described above in the example of FIG. 3. In an example, the reference signal can be the same or different than the reference signal provided to the first sigma-delta ADC circuit at 540.

The second digital output signal can be used by a feedback DAC circuit, such as an ADC channel-specific DAC circuit, to gate or control application of the reference signal to the sigma-delta ADC circuit. For example, the feedback DAC circuit can be configured to switchably couple an ADC circuit input with one of a reference current signal or a reference voltage signal. The state of the second digital output signal can determine which of the reference current or the reference voltage signals is coupled to the ADC circuit input, such as described above in the discussion of FIG. 3, and in the discussion of FIG. 5 at 540. The information link between the second digital output and the input to the second integrator circuit 312 can be continuously operable, such as independently of the SEL and SAMPLE control signals, and independently of the information link established at 540.

At 580, a third digital output signal can be provided, such as based on the first and second digital output signals provided at 530 and 560, respectively. In an example, the third digital output signal can represent or indicate a relationship, such as a difference, between the first and second digital output signals. For example, the third digital output signal can include information about a difference in signal magnitude between the first and second phases of the input signal. In an example, the third digital output signal can represent a ratio or other relationship between the first and second digital output signals. The first and second digital output signals can, in some applications, include common-mode error signal components that can be disregarded when the ratio of the output signals is used, such as to provide temperature or power supply status information.

Figure 6:
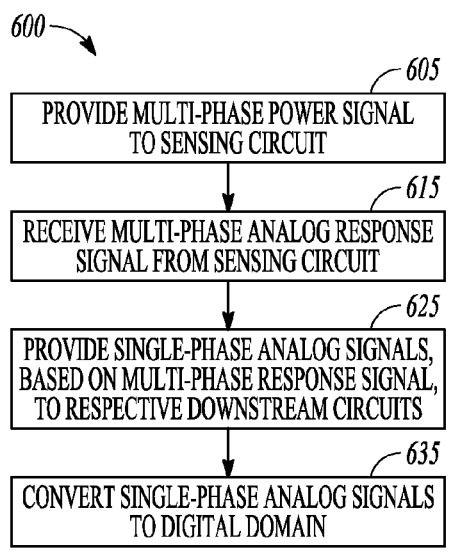
FIG. 6 illustrates generally an example that can include sensing a power signal over multiple phases.

FIG. 6 illustrates generally an example 600 that can include sensing a power signal, such as over multiple phases. At 605, the example 600 can include providing a multi-phase power signal to a sensing circuit. The multi-phase power signal can include, among others, an AC signal, or a pulse signal. The sensing circuit can include, among others, a resistor, a thermistor, or other circuit or device that can provide a current signal or a voltage signal that can represent a measurable characteristic such as a relative temperature or a power level.

At 615, a multi-phase analog response signal can be received from the sensing circuit. The multi-phase analog response signal can include a current signal or a voltage signal, such as can be separated into single-phase components for further processing. At 625, the multi-phase analog response signal can be provided to one or more sigma-delta ADC converter circuits by way of one or more gate circuits or multiplexing circuits, such as described above in the example of FIG. 3. For example, the gate circuit 302 or the phase-select multiplexer circuit 303 can be configured to receive the multiphase analog response signal and, in response, provide a single-phase analog signal portion to one or more downstream circuits or devices. At 635, a single-phase of the response signal can be received by an input stage of a sigma-delta ADC circuit. In response, the sigma-delta ADC circuit can provide a digital bit stream representative of the single-phase signal.

VARIOUS NOTES

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An analog-to-digital signal processing system comprising:
    first and second signal processing channels, including respective inputs configured to receive an analog input signal that is time-multiplexed such that the input of the first signal processing channel receives the input signal during a first phase and the input of the second signal processing channel receives the input signal during a second phase;
    a first feedback circuit, including a first DAC circuit, coupling information from the output of the first signal processing channel to the input of the first signal processing channel during both of the first and second phases;
    a second feedback circuit, separate from the first feedback circuit and including a second DAC circuit, coupling information from the output of the second signal processing channel to the input of the second signal processing channel during both of the first and second phases; and
    a supply circuit configured to supply a current signal to each of the first and second DAC circuits, the supply circuit comprising at least two current sources coupled to a chop circuit, and the chop circuit is configured to selectively couple currents from the at least two current sources to the first and second DAC circuits according to a specified duty cycle.

2. The system of claim 1, comprising a difference circuit, coupled to respective outputs of the first and second signal processing channels and forming a difference signal based on a difference between the respective outputs of the first and second signal processing channels.

3. The system of claim 2, wherein the difference circuit is configured to form a difference signal based on the difference between the respective outputs of the first and second signal processing channels.

4. The system of claim 1, wherein outputs of the first and second DAC circuits are respectively coupled to the inputs of the first and second signal processing channels during both of the first and second phases.

5. The system of claim 1, wherein the at least two current sources of the supply circuit comprise a pair of current mirrors coupled to the chop circuit, and wherein the chop circuit is configured to selectively couple currents from the current mirrors to the first and second DAC circuits according to the specified duty cycle.

6. The system of claim 1, wherein the first feedback circuit includes a first demultiplexer circuit that is operable, in response to the output of the first signal processing channel, to selectively couple a reference signal to the input of the first signal processing channel; and wherein the second feedback circuit includes a second demultiplexer circuit that is operable, in response to the output of the second signal processing channel, to selectively couple a reference signal to the input of the second signal processing channel.

7. The system of claim 1, wherein the first and second signal processing channels include at least a portion of respective first and second sigma-delta modulator circuits.

8. The system of claim 7, wherein the first and second sigma-delta modulator circuits include respective integrator inputs that are coupled to a third demultiplexer circuit, wherein the third demultiplexer circuit is configured to receive the time-multiplexed analog input signal, and wherein the third demultiplexer circuit is operable in response to a control signal.

9. The system of claim 1, including a gate circuit, wherein the gate circuit is configured to selectively couple the analog input signal to a demultiplexer circuit, and wherein the demultiplexer circuit is configured to selectively provide the analog input signal to one of the first and second processing channels.

10. A method of providing modulated output signals based on a time-interleaved input signal, the method comprising:
providing, using an input demultiplexer circuit, a time-multiplexed input signal to one of a first or a second signal processing channel;
receiving a first portion of the time-multiplexed input signal at a first sigma-delta converter input in the first signal processing channel;
providing a first digital output signal based on a difference between the received first portion of the input signal and a first reference signal;
selectively providing the first reference signal to the first sigma-delta converter input using a first demultiplexer circuit in a feedback path of the first signal processing channel, the selectively providing the first reference signal using the first digital output signal and using a first current signal received from a chop circuit;
receiving a subsequent second portion of the input signal at a second sigma-delta converter input in the second signal processing channel;
providing a second digital output signal based on a difference between the second portion of the input signal and a second reference signal; and
selectively providing the second reference signal to the second sigma-delta converter input using a second demultiplexer circuit in a feedback path of the second signal processing channel, the selectively providing the second reference signal using the second digital output signal and using a second current signal received from the chop circuit.

11. The method of claim 10, comprising providing a third digital output signal indicative of a difference between the first and second digital output signals from the first and second signal processing channels.

12. The method of claim 10, wherein the first and second current signals received from the chop circuit are received according to a specified duty cycle of the chop circuit.

13. The method of claim 10, comprising continuously providing information from the first demultiplexer circuit to the first sigma-delta converter input, and continuously providing information from the second demultiplexer circuit to the second sigma-delta converter input.

14. The method of claim 10, wherein the providing the time-multiplexed input signal includes receiving a response from a sensing circuit or sensing element to at least first and subsequent second phases of a power signal.

15. An analog-to-digital signal processing system for detecting a difference between portions of a time-multiplexed input signal, the system comprising:
a first continuous-time sigma-delta analog-to-digital converter circuit channel (first ADC channel) including a first input node and a first output node;
a second continuous-time sigma-delta analog-to-digital converter circuit channel (second ADC channel) including a second input node and a second output node;
a first feedback digital-to-analog converter circuit including a first demultiplexer circuit, the first feedback circuit configured to continuously provide information about the first output node of the first ADC channel to the first input node;
a different second feedback digital-to-analog converter circuit including a second demultiplexer circuit, the different second feedback circuit configured to continuously provide information about the second output node of the second ADC channel to the second input node; and
a chop circuit configured to provide respective portions of a reference signal to the first and second demultiplexer circuits.

16. The system of claim 15, wherein the first demultiplexer circuit is switchable based on information received from the first output node; and
wherein the second demultiplexer circuit is switchable based on information received from the second output node.

17. The system of claim 16, wherein the chop circuit provides the respective portions of the reference signal based on a specified duty cycle.

18. The system of claim 17, comprising a reference signal generator circuit; and
wherein the chop circuit is configured to provide substantially similar reference signals to each of the first and second demultiplexer circuits using a duty cycle of about 50%.

19. The system of claim 15, comprising an input demultiplexer circuit configured to selectively couple a common input node to one of the first and second input nodes; and
a current sensor circuit, wherein the current sensor circuit is configured to provide a time-multiplexed input signal to the input demultiplexer circuit.

20. The system of claim 15, comprising a difference circuit configured to provide a digital output signal indicative of a difference between signals at the first and second output nodes.

* * * * *